United States Patent
Ichinohe et al.

(10) Patent No.: US 10,495,671 B2
(45) Date of Patent: Dec. 3, 2019

(54) CURRENT DETECTION DEVICE

(71) Applicant: Alps Alpine Co., Ltd., Tokyo (JP)

(72) Inventors: Kenji Ichinohe, Niigata-ken (JP);
Naoki Sakazume, Niigata-ken (JP);
Mitsuhiro Goto, Niigata-ken (JP);
Yosuke Ide, Niigata-ken (JP); Hidenori Hataya, Niigata-ken (JP); Hideaki Kawasaki, Niigata-ken (JP); Akira Takahashi, Niigata-ken (JP); Yoshihiro Nishiyama, Niigata-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 108 days.

(21) Appl. No.: 15/913,258

(22) Filed: Mar. 6, 2018

(65) Prior Publication Data
US 2018/0196088 A1  Jul. 12, 2018

Related U.S. Application Data

(63) Continuation of application No. PCT/JP2016/074284, filed on Aug. 19, 2016.

(30) Foreign Application Priority Data

Oct. 14, 2015 (JP) .................................. 2015-202698
Mar. 23, 2016 (JP) .................................. 2016-058282

(51) Int. Cl.
*G01R 15/20* (2006.01)
(52) U.S. Cl.
CPC .................................. *G01R 15/205* (2013.01)
(58) Field of Classification Search
CPC .................................................. G01R 15/205

USPC .......................................................... 324/260
See application file for complete search history.

(56) References Cited

U.S. PATENT DOCUMENTS

| 6,751,055 B1* | 6/2004 | Alfoqaha ............... B82Y 10/00 360/123.47 |
| 8,754,642 B2* | 6/2014 | Ide ......................... B82Y 25/00 324/252 |
| 2006/0103980 A1 | 5/2006 | Sasaki et al. |
| 2009/0032494 A1 | 2/2009 | Sasaki et al. |
| 2009/0086370 A1 | 4/2009 | Sasaki et al. |
| 2013/0057273 A1 | 3/2013 | Ide et al. |

FOREIGN PATENT DOCUMENTS

| JP | H10-074307 | 3/1998 |
| JP | 2006-139898 | 6/2006 |
| JP | 2011-029222 | 2/2011 |
| JP | 2013-53903 | 3/2013 |

OTHER PUBLICATIONS

International Search Report dated Oct. 18, 2016 from International Application No. PCT/JP2016/074284.

* cited by examiner

*Primary Examiner* — Reena Aurora
(74) *Attorney, Agent, or Firm* — Beyer Law Group LLP

(57) ABSTRACT

Magnetic detectors and a lower insulating layer covering the magnetic detectors are disposed on a substrate. On the lower insulating layer, a coil layer including a plurality of segments forming a counter detector of a feedback coil is disposed. Height adjustment layers are disposed on both sides of the coil layer. The coil layer and the height adjustment layers are covered with an upper insulating layer, and a shield layer is disposed thereon. Accordingly, the shield layer can be made substantially flat.

9 Claims, 12 Drawing Sheets

CURRENT DETECTION DEVICE

CLAIM OF PRIORITY

This application is a Continuation of International Application No. PCT/JP2016/074284 filed on Aug. 19, 2016, which claims benefit of Japanese Patent Applications No. 2015-202698 filed on Oct. 14, 2015 and No. 2016-058282 filed on Mar. 23, 2016. The entire contents of each application noted above are hereby incorporated by reference.

BACKGROUND OF THE INVENTION

1. Field of the Invention

The present invention relates to a current detection device of a so-called magnetic balance type including a feedback coil.

2. Description of the Related Art

Japanese Unexamined Patent Application Publication No. 2013-53903 describes an invention related to a current detection device of a so-called magnetic balance type.

In this current detection device, a magnetoresistive element and a feedback coil face a conductor through which a current to be measured passes. A current magnetic field excited by the current that is to be measured and that flows through the conductor is detected by the magnetoresistive element, and control is performed so that a feedback current corresponding to the magnitude of the detection output is applied to the feedback coil. A cancelling magnetic field, which is reverse to the current magnetic field, is applied from the feedback coil to the magnetoresistive element. When the current magnetic field and the cancelling magnetic field reach a balanced state, the current flowing through the feedback coil is detected, and the detection output of the current is obtained as a measured value of the current.

As illustrated in FIG. 4, in the current detection device described in Japanese Unexamined Patent Application Publication No. 2013-53903, a shield layer is disposed between the conductor through which a current to be measured flows and the feedback coil. The shield layer weakens the current magnetic field induced by the current to be measured, and the weakened current magnetic field is applied to the magnetoresistive element. Accordingly, the range of intensity of the current to be measured that can be detected by the magnetoresistive element is widened, and the dynamic range for measuring the current magnetic field can be expanded.

To manufacture the current detection device described in Japanese Unexamined Patent Application Publication No. 2013-53903, it is necessary to laminate, on a substrate, a magnetoresistive element, a lower insulating layer that covers the magnetoresistive element, a feedback coil located on the lower insulating layer, and an upper insulating layer that covers the feedback coil in this order, and to form a shield layer on the upper insulating layer in a plating process so as to cover the feedback coil.

The upper insulating layer that covers the feedback coil may be an organic insulating layer. However, the organic insulating layer, which is hygroscopic, may deteriorate the feedback coil and the shield layer that are in contact with the upper insulating layer. In addition, since the organic insulating layer swells by absorbing water, stress is applied to the magnetoresistive element, the feedback coil, and so forth, and accordingly the bonding strength at the boundary between the upper insulating layer and the shield layer is more likely to decrease.

For this reason, it is preferable to form the upper insulating layer by using an inorganic material, such as Si-Nx.

However, if the insulating layer made of an inorganic material is formed by using chemical vapor deposition (CVD) or spattering, relatively large stepped portions are inevitably produced at a surface of the upper insulating layer, from an upper surface of a coil layer constituting the feedback coil to both outer sides of the coil layer at both side portions of the feedback coil, because the coil layer has a relatively large height. The shield layer needs to have a width for covering the feedback coil, and thus the shield layer is formed to cover the stepped portions at the surface of the upper insulating layer at both side portions of the shield layer.

A process of manufacturing a current detection device includes a heating process, such as a process of firing a resin for a package, after a shield layer has been formed, and also includes another heating process of soldering the current detection device that has been completed to a mother substrate. There is a large difference in linear expansion coefficient between the upper insulating layer made of an inorganic material and the shield layer made of a metallic material by using plating. Thus, heat stress is likely to affect the boundary between the upper insulating layer and the shield layer during a cooling process after each heating process.

As described above, if the upper insulating layer is formed by using an inorganic material, stepped portions are likely to be produced in the upper insulating layer at both side portions of the feedback coil, and the shield layer is superimposed on the stepped portion while being deformed. In such a multilayer structure, the heat stress between the upper insulating layer and the shield layer concentrates on the stepped portion of both the layers, and the concentration of stress is likely to cause a crack at the stepped portions of the upper insulating layer.

In addition, if stepped portions are formed at the surface of the upper insulating layer, step-like deformed portions are formed also on both sides of the shield layer. The deformed portions formed on both sides of the shield layer decreases an anisotropic magnetic field Hk in the width direction of the shield layer, that is, in the sensitivity-axis direction of the magnetoresistive element, and saturated magnetization in the same direction of the shield layer decreases. As a result, a shield effect decreases and the dynamic range of a current to be measured becomes narrow.

SUMMARY OF THE INVENTION

The present invention provides a current detection device capable of suppressing the occurrence of a crack in an upper insulating layer caused by heat stress, by adopting a multilayer structure in which there is no large stepped portions at a bonding portion between an upper insulating layer that covers a feedback coil and a shield layer disposed on the upper insulating layer.

The present invention also provides a current detection device that includes a shield layer which can be easily formed in a flat shape and that is capable of suppressing a decrease in saturated magnetization in a sensitivity-axis direction of a magnetic detector.

A current detection device according to the present invention includes a current path through which a current to be measured flows; a coil layer having a planer helical pattern; a magnetic detector facing the coil layer; a shield layer disposed between the current path and the coil layer; a coil energization section configured to control a current to be applied to the coil layer in accordance with an increase or decrease in a detection output of the magnetic detector; and a current detector configured to detect an amount of current flowing in the coil layer. The coil layer, a height adjustment layer, and an upper insulating layer are disposed on a lower insulating layer that covers the magnetic detector, the coil layer including a plurality of segments arranged in the helical pattern, the height adjustment layer being made of a nonmagnetic metal and being disposed on both sides of the coil layer including the plurality of segments, and the upper insulating layer being made of an inorganic material and covering the coil layer and the height adjustment layer. The shield layer, which is disposed on the upper insulating layer, covers both the coil layer including the plurality of segments and the height adjustment layer, and both side portions of the shield layer are located above the height adjustment layer.

In the current detection device according to the present invention, the coil layer and the height adjustment layer may preferably have an identical height.

In the current detection device according to the present invention, the coil layer and the height adjustment layer may preferably be plated layers, and the coil layer and the height adjustment layer may preferably be made of an identical conductive metallic material.

In the current detection device according to the present invention, the height adjustment layer may preferably have a length in a direction in which the current flows in the coil layer, the length being larger than a length in the direction of the shield layer.

In the current detection device according to the present invention, the height adjustment layer may preferably have a width in a crossing direction that crosses a direction in which the current flows in the coil layer, the width being larger than a width in the crossing direction of each of the plurality of segments included in the coil layer.

In the current detection device according to the present invention, the shield layer may preferably include the side portions extending in a longitudinal direction of the shield layer and located above the height adjustment layer, and end portions extending in a lateral direction of the shield layer and crossing the current flowing in the coil layer, and the shield layer may preferably have a larger dimension in the longitudinal direction than in the lateral direction. The end portions may preferably have a curve shape protruding in the longitudinal direction over an entire length in the lateral direction when viewed in plan.

In the current detection device according to the present invention, the end portions may preferably have a substantially semicircular shape when viewed in plan.

In the current detection device according to the present invention, a sensitivity-axis direction of the magnetic detector may preferably correspond to the lateral direction.

In the current detection device according to the present invention, a coil layer including a plurality of segments arranged in a helical pattern and a height adjustment layer disposed on both sides of the coil layer are covered with an upper insulating layer made of an inorganic material, and a shield layer is disposed on the upper insulating layer so as to cover both the coil layer and the height adjustment layer. Thus, stepped portions can be prevented from being formed at the bonding boundary between the upper insulating layer and the shield layer on both side portions of the coil layer including the plurality of segments. Even if heat stress is produced between the upper insulating layer and the shield layer, partial concentration of the heat stress can be prevented, and a crack is less likely to be produced in the upper insulating layer.

The shield layer can be formed into a substantially flat shape. Thus, a decrease in saturated magnetization in the shield layer in a sensitive-axis direction of the magnetic detector can be prevented, and a decrease in the dynamic range of a current to be measured can be prevented. Furthermore, since the shield layer can be formed into a substantially flat shape, the linearity of a detection output can be increased.

DESCRIPTION OF THE PREFERRED EMBODIMENTS

Figure 1:
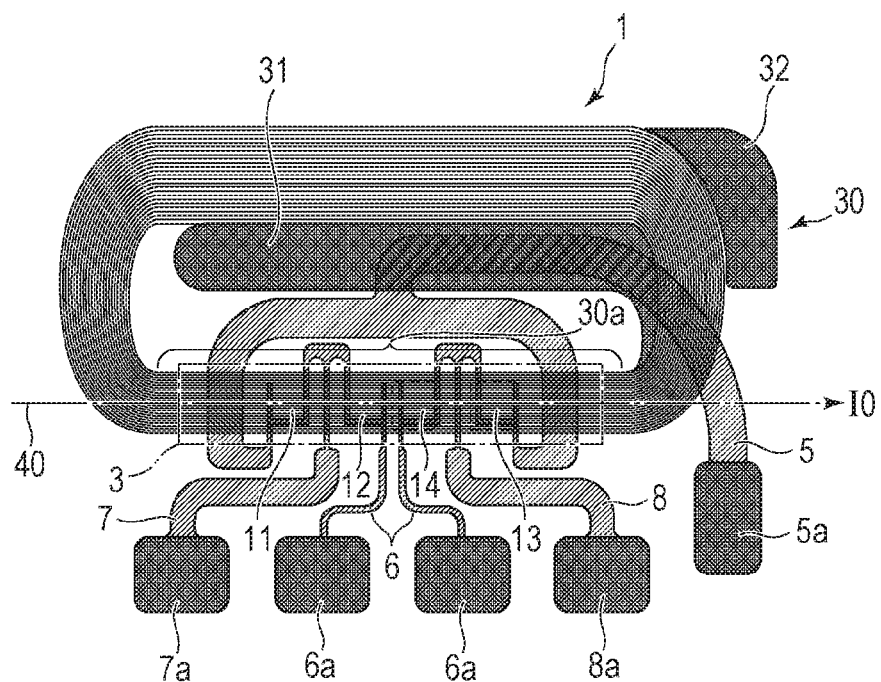
FIG. 1 is a plan view illustrating a current detection device according to an embodiment of the present invention.
Figure 1:
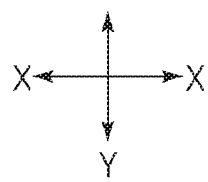
Figure 3:
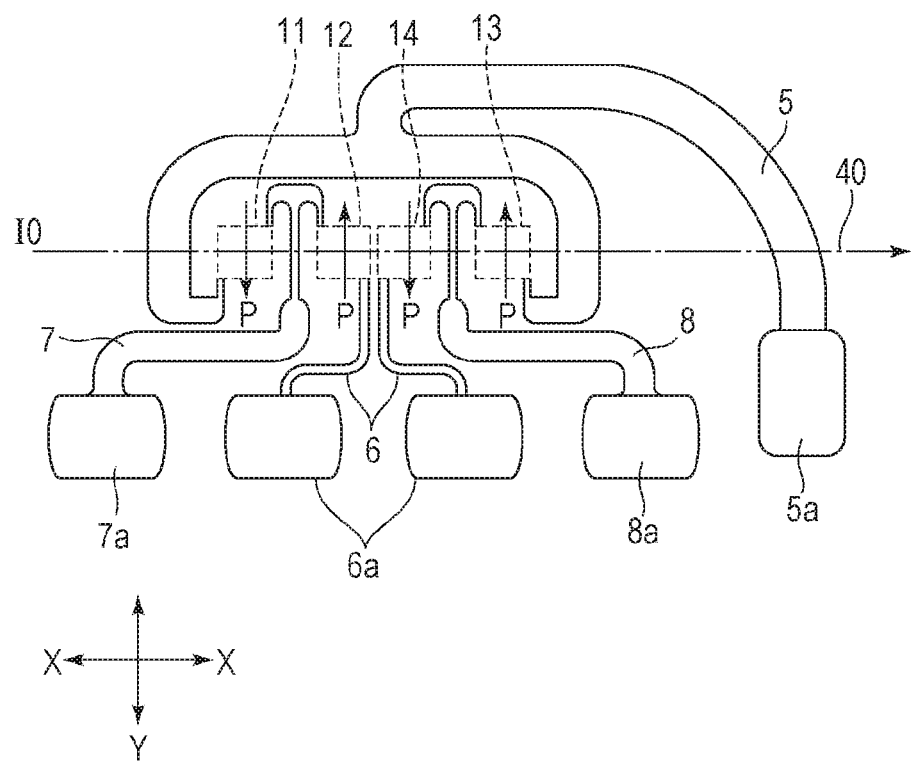
FIG. 3 is a plan view illustrating magnetic detectors included in the current detection device illustrated in FIG. 1 and a wiring structure thereof.

A current detection device 1 according to an embodiment of the present invention is for detecting an amount of current 10 to be measured flowing through a current path 40 illustrated in FIGS. 1 and 3, and includes magnetic detectors 11, 12, 13, and 14, a feedback coil 30, and a shield layer 3 disposed between the current path 40 and the feedback coil 30.

Figure 5:
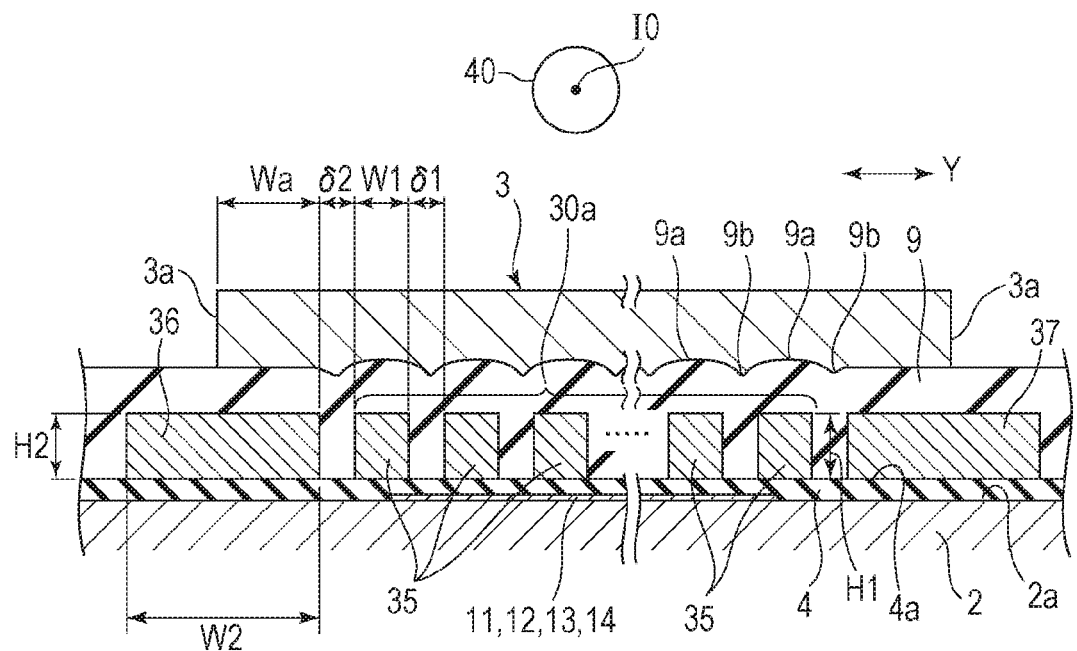
FIG. 5 is a cross sectional view taken along line V-V of FIG. 4.

As illustrated in the cross-sectional view in FIG. 5, the current detection device 1 includes a substrate 2. The substrate 2 is a silicon (Si) substrate. The substrate 2 includes a surface 2a, which is flat. The magnetic detectors 11, 12, 13, and 14 are disposed on the surface 2a.

As illustrated in FIGS. 1 and 3, the magnetic detectors 11, 12, 13, and 14 are arranged at constant intervals in an X direction. The current path 40 extends in the X direction, through which the current 10 to be measured flows in the right direction in the figures. As illustrated in FIG. 5, the current path 40 is above the substrate 2 and is separated from the substrate 2. The current path 40 faces all the magnetic detectors 11, 12, 13, and 14, and a counter detector 30a of the feedback coil 30 disposed above the magnetic detectors 11, 12, 13, and 14.

Figure 8:
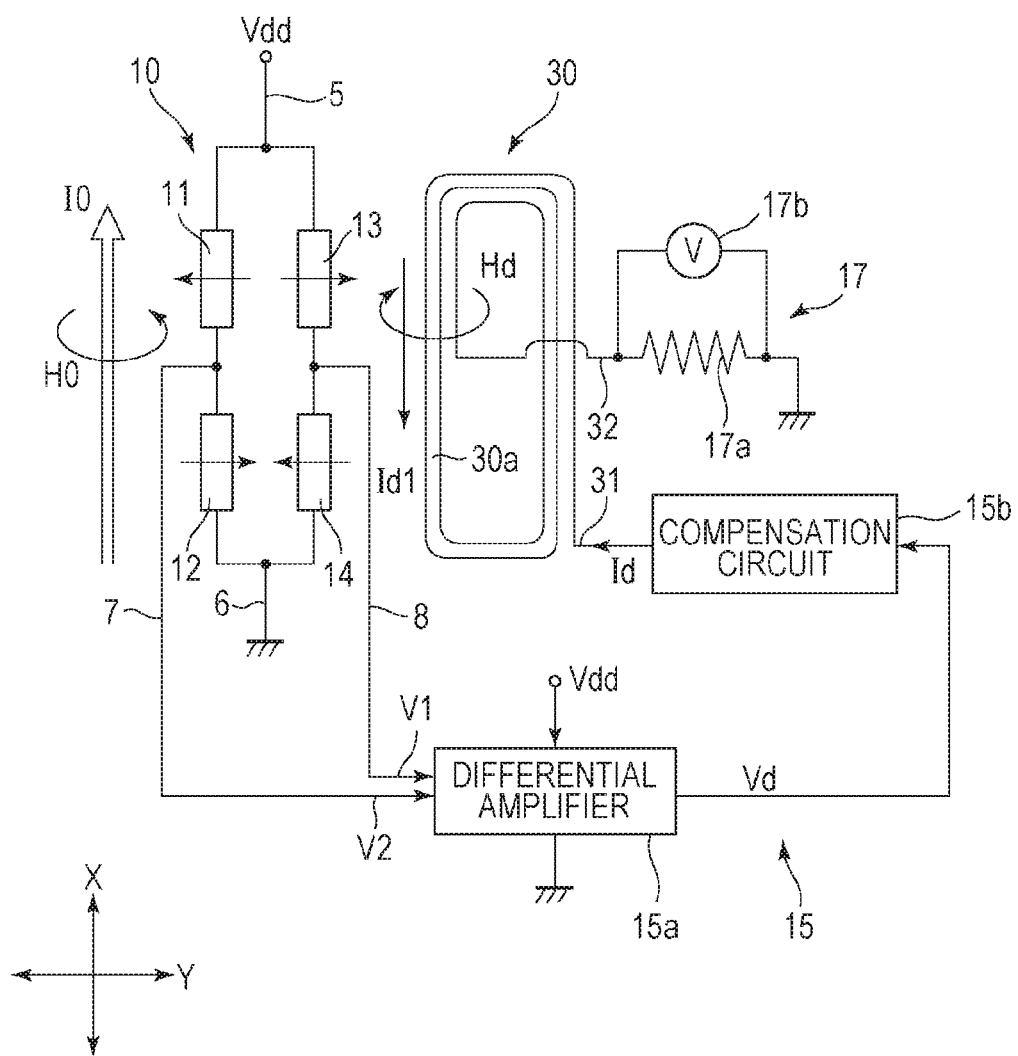
FIG. 8 is a circuit diagram of the current detection device.

FIGS. 1 and 3 illustrate the arrangement structure and wiring structure of the magnetic detectors 11, 12, 13, and 14, and FIG. 8 illustrates the circuit diagram thereof.

The magnetic detector 11 located at the left end in FIGS. 1 and 3 and the magnetic detector 13 located at the right end in FIGS. 1 and 3 are connected to a wiring path 5. At a terminal portion of the wiring path 5, a connection land portion 5a is disposed. The magnetic detectors 11 and 12 are connected in series to each other, and the magnetic detectors 13 and 14 are connected in series to each other. The magnetic detectors 12 and 14, which are located at the center, are connected to respective wiring paths 6. At terminal portions of the respective wiring paths 6, connection land portions 6a are disposed.

A wiring path 7 is connected between the magnetic detectors 11 and 12 that are connected in series to each other, and a wiring path 8 is connected between the magnetic detectors 13 and 14 that are connected in series to each other. A connection land portion 7a is disposed at a terminal portion of the wiring path 7, and a connection land potion 8a is disposed at a terminal portion of the wiring path 8.

The wiring paths 5, 6, 7, and 8 are formed of a conductive layer, which is made of gold, copper, or the like, disposed on the surface 2a of the substrate 2. Also, the connection land portions 5a, 6a, 7a, and 8a are formed of a conductive layer, which is made of gold or the like.

Each of the magnetic detectors 11, 12, 13, and 14 is made up of a plurality of magnetoresistive elements in a striped shape, having a length in the X direction larger than a width in the Y direction. In the magnetic detectors 11, 12, 13, and 14, the plurality of magnetoresistive elements in a striped shape are arranged in a so-called meander pattern and are connected in series to each other. The end portions of the magnetoresistive elements arranged in the meander pattern are connected to any one of the wiring paths 5, 6, 7, and 8.

The magnetoresistive elements are formed of a giant magnetoresistive element layer (GMR layer) having a giant magnetoresistance effect, the GMR layer including a fixed magnetic layer, a nonmagnetic layer, and a free magnetic layer laminated in order on an insulating base layer disposed on the surface 2a of the substrate 2. The surface of the free magnetic layer is covered with a protective layer. These layers are formed by CVD or spattering, and are then formed into a striped shape by etching. Furthermore, a connecting conductive layer for connecting the striped-shape magnetoresistive elements in a meander pattern is formed.

The fixed magnetic layer and the free magnetic layer form a striped shape in which the longitudinal direction corresponds to the X direction. The magnetization of the fixed magnetic layer is fixed in the Y direction.

In FIG. 3, magnetization fixation directions P of the fixed magnetic layer are indicated by arrows. The magnetization fixation directions P are sensitive-axis directions of the individual magnetoresistive elements and are sensitive-axis directions of the magnetic detectors 11, 12, 13, and 14. The magnetoresistive elements constituting the magnetic detectors 11 and 14 have the same magnetization fixation direction P, and the sensitive axes thereof correspond to the downward direction in the figure. The magnetoresistive elements constituting the magnetic detectors 12 and 13 have the same magnetization fixation direction P, and the sensitive axes thereof correspond to the upward direction in the figure.

In each magnetoresistive element, the magnetization in the free magnetic layer is directed in the X direction by shape anisotropy and a bias magnetic field. In each magnetic detector, when an external magnetic field in a sensitive-axis direction (P direction) is applied, the magnetization direction that is the X direction in the free magnetic layer is tilted in the Y direction. When an angle between a vector of magnetization in the free magnetic layer and the magnetization fixation direction P decreases, the electric resistance of the magnetoresistive element decreases. When the angle between the vector of magnetization in the free magnetic layer and the magnetization fixation direction P increases, the resistance of themagnetoresistive element increases.

As illustrated in the circuit diagram in FIG. 8, a power source Vdd is connected to the wiring path 5, the wiring paths 6 are set to a ground potential, and a bridge circuit made up of the magnetic detectors 11, 12, 13, and 14 is applied with a constant voltage. A midpoint voltage V1 is obtained from the wiring path 8, and a midpoint voltage V2 is obtained from the wiring path 7.

As illustrated in FIG. 5, the magnetic detectors 11, 12, 13, and 14 and the wiring paths 5, 6, 7, and 8 are covered with a lower insulating layer 4. The lower insulating layer 4 is made of silicon nitride (Si-Nx) and is formed by using CVD.

Figure 2:
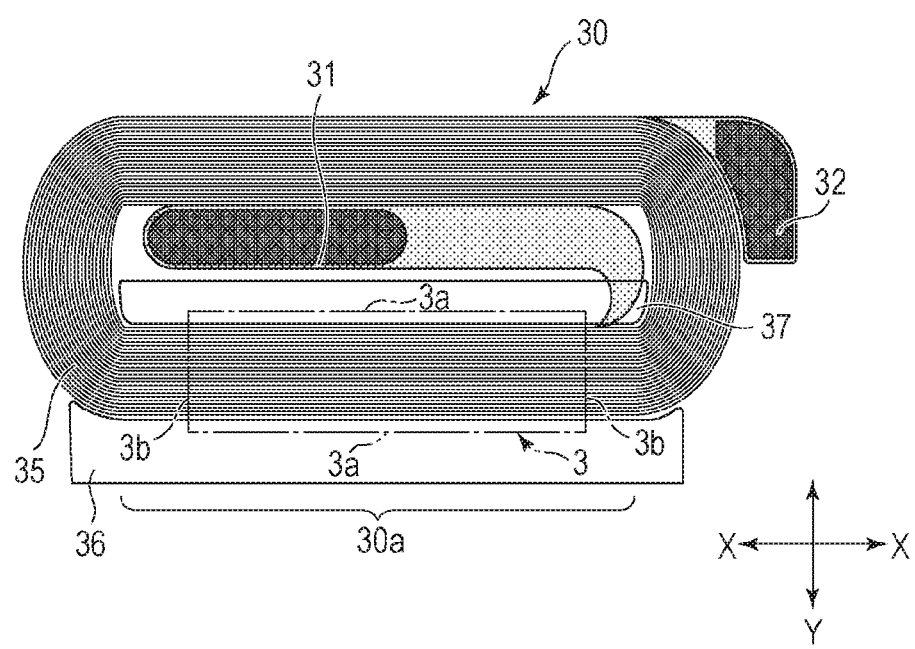
FIG. 2 is a plan view illustrating a feedback coil, height adjustment layers, and a shield layer included in the current detection device illustrated in FIG. 1.

As illustrated in FIG. 5, the feedback coil 30 is disposed on a surface 4a of the lower insulating layer 4. The plane pattern of the feedback coil 30 is illustrated in FIGS. 1 and 2. The feedback coil 30 is wound clockwise in a helical manner from one land portion 31 toward another land portion 32. A portion that is located above the magnetic detectors 11, 12, 13, and 14 and that faces the current path 40 serves as the counter detector 30a.

FIG. 5 illustrates the cross section of a region where the counter detector 30a is disposed. The feedback coil 30 is formed of a coil layer 35 that has a substantially rectangular cross section and that is planarly wound in a helical pattern. In the counter detector 30a, a plurality of segments of the wound coil layer 35 are arranged in the Y direction. In the counter detector 30a, the plurality of segments of the coil layer 35 are arranged at constant intervals in the Y direction and are linearly arranged in parallel in the X direction.

The coil layer 35 is a plated layer and is made of gold, which is a low-resistance nonmagnetic metallic layer. Alternatively, the coil layer 35 may be made of another type of metal, such as copper. Each segment of the coil layer 35 has a cross-sectional shape having a width W1 of about 15 to 40 μm and a height H1, which is equal to or slightly larger than the foregoing width W1.

Figure 4:
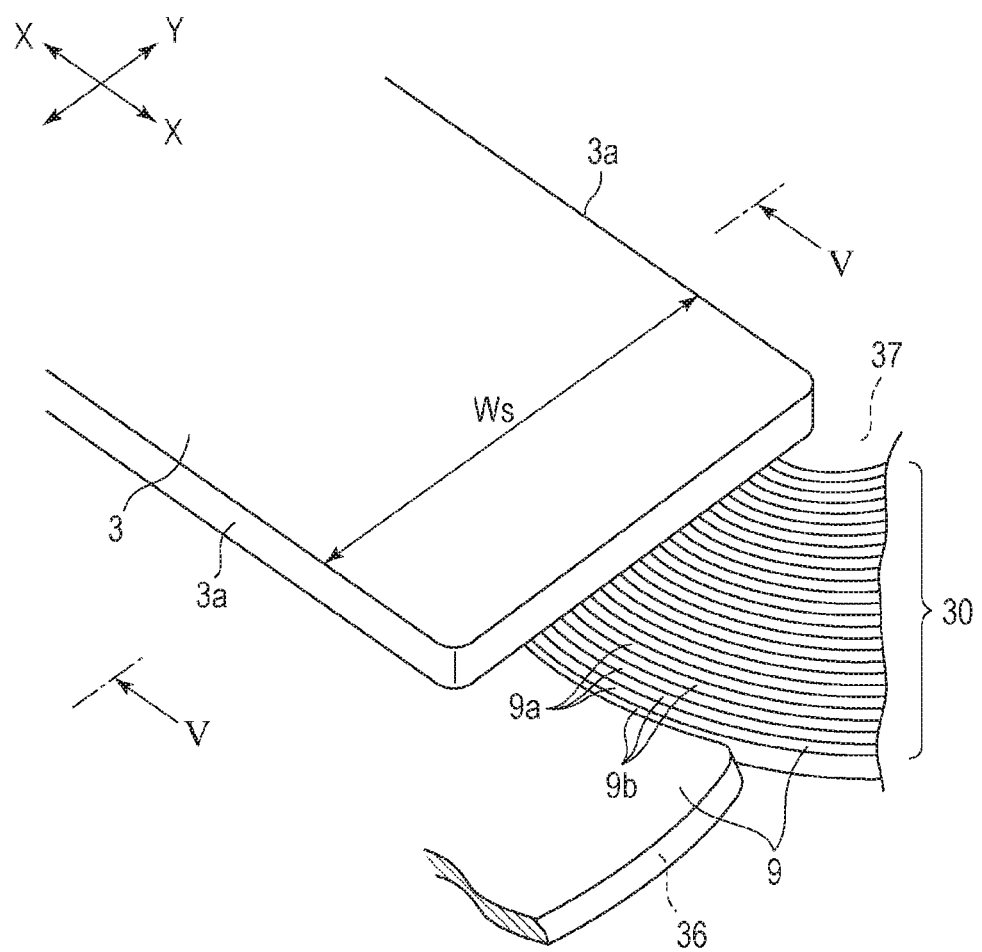
FIG. 4 is a partial perspective view illustrating the feedback coil, the height adjustment layers, and the shield layer included in the current detection device illustrated in FIG. 1.

As illustrated in FIGS. 2, 4, and 5, on the surface 4a of the lower insulating layer 4, a height adjustment layer 36 is disposed on an outer side in the Y direction of the counter detector 30a including the plurality of segments of the coil layer 35, and a height adjustment layer 37 is disposed on an inner side in the Y direction of the counter detector 30a. The height adjustment layers 36 and 37 are plated layers made of a nonmagnetic metallic material. Preferably, the height adjustment layers 36 and 37 are made of the same metallic material as that of the coil layer 35 and are formed in the same plating process as that for forming the coil layer 35.

Alternatively, the height adjustment layers 36 and 37 may be made of a metal different from the metal of the coil layer 35, for example, aluminum, and may be formed in a process different from the process of forming the coil layer 35.

As illustrated in FIG. 5, a height H2 of the height adjustment layers 36 and 37 is equal to the height H1 of the coil layer 35. The width W2 in the Y direction of the height adjustment layers 36 and 37 is sufficiently larger than the width W1 in the Y direction of the coil layer 35. An interval δ2 in the Y direction between the height adjustment layers 36 and 37 and the coil layer 35 adjacent thereto is preferably equal to or smaller than an interval δ1 between the segments adjacent to each other of the coil layer 35 in the counter detector 30a.

As illustrated in FIG. 5, an upper insulating layer 9 is disposed on the plurality of segments of the coil layer 35 and the height adjustment layers 36 and 37 located on both sides thereof. The upper insulating layer 9 is a silicon nitride (Si-Nx) layer and is formed by using CVD. FIG. 4 illustrates an external appearance in a state where the coil layer 35 constituting the feedback coil 30 and the height adjustment layers 36 and 37 are covered with the upper insulating layer 9. As a result that the upper insulating layer 9 is formed by using CVD, bulges 9a are formed at its surface just above the coil layer 35, and recesses 9b are formed between the segments adjacent to each other of the coil layer 35 and between the height adjustment layers 36 and 37 and the coil layer 35.

Figure 6:
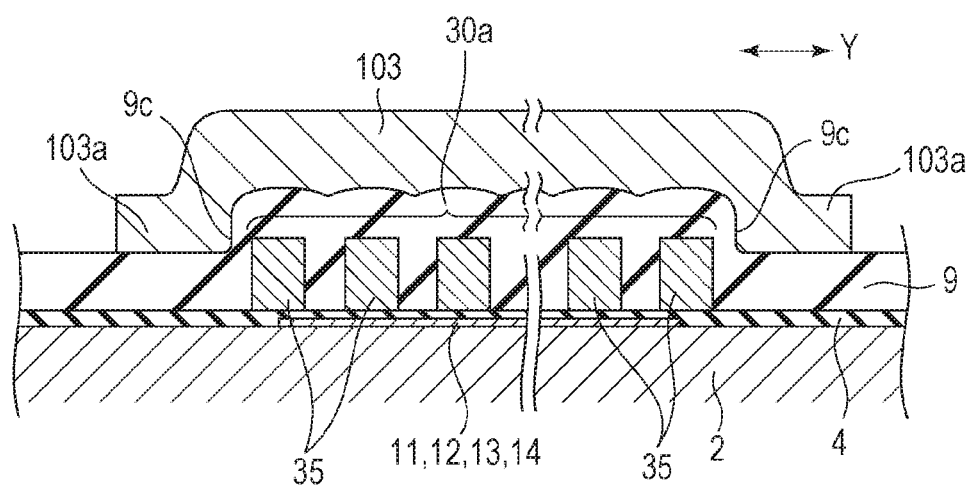
FIG. 6 is a cross sectional view, similar to FIG. 5, illustrating a current detection device according to a comparative example.

FIG. 6 illustrates a comparative example in which the height adjustment layers 36 and 37 are not provided. As illustrated in this comparative example, if the upper insulating layer 9 is formed by using CVD or spattering, stepped portions 9c are formed at the surface of the upper insulating layer 9 on both sides in the Y direction of the region where the plurality of segments of the coil layer 35 are arranged. In contrast, in the embodiment of the present invention, the height adjustment layers 36 and 37 are provided on both sides of the coil layer 35 as illustrated in FIGS. 4 and 5, and accordingly no large stepped portions are formed at the surface of the upper insulating layer 9 on both sides in the Y direction of the region where the plurality of segments of the coil layer 35 are arranged.

As illustrated in FIG. 5, the shield layer 3 is disposed on the surface of the upper insulating layer 9. The shield layer 3 is a plated layer made of a magnetic metallic material, such as Ni—Fe alloy (nickel-iron alloy). As illustrated in FIG. 5, the shield layer 3 continuously extends in the Y direction so as to cover the plurality of segments of the coil layer 35 constituting the feedback coil 30 and the height adjustment layers 36 and 37 on both sides thereof.

Side portions 3a of the shield layer 3 along the Y direction are located on an outer side in the Y direction of the region where the coil layer 35 is disposed. The side portions 3a are located just above the height adjustment layers 36 and 37. As illustrated in FIG. 5, a width Wa in the Y direction of a region where the shield layer 3 and the height adjustment layers 36 and 37 overlap each other is larger than the interval δ2 between the height adjustment layers 36 and 37 and the coil layer 35.

Figure 7A:
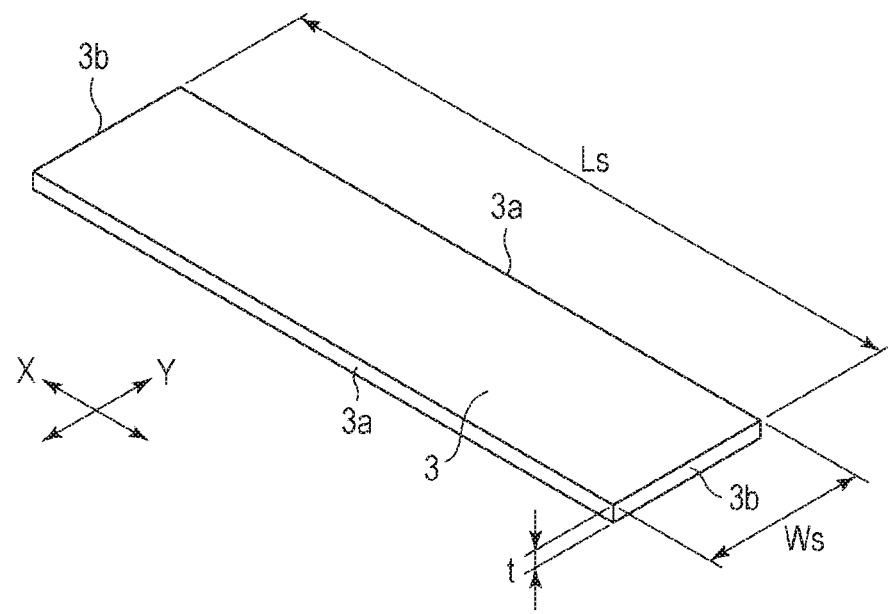
FIG. 7A is a perspective view illustrating the shield layer included in the current detection device according to the embodiment of the present invention.

As a result, as illustrated in FIGS. 4 and 7A, the shield layer 3 is substantially planar and does not have a large deformed portion over the entire width Ws in the lateral direction (Y direction). As illustrated in FIG. 1, the shield layer 3 covers all the magnetic detectors 11, 12, 13, and 14 from the top and also covers the counter detector 30a of the feedback coil 30. As illustrated in FIG. 2, the height adjustment layers 36 and 37 protrude from the side portions 3a in the X direction of the shield layer 3 on both sides in the X direction. Thus, also in the X direction, the shield layer 3 is planar and does not have a deformed portion resulting from a stepped portion.

The current detection device 1 is subjected to a plurality of heating processes after the shield layer 3 has been formed. For example, the heating processes include a process of curing an organic insulating layer, a process of firing resin in a packaging process, and a soldering process for mounting the current detection device 1 on a mother substrate. Since the linear expansion coefficient differs between the Ni—Fe alloy forming the shield layer 3 and Si-Nx as an inorganic material of the upper insulating layer 9, heat stress is produced at the boundary between the shield layer 3 and the upper insulating layer 9 during a cooling process after the heating processes.

In the comparative example illustrated in FIG. 6, the height adjustment layers 36 and 37 are not provided. Thus, the large stepped portions 9c are formed on the surface of the upper insulating layer 9 on both sides in the Y direction of the region where the coil layer 35 is disposed, and the shield layer 3 is superimposed on the stepped portions 9c. Accordingly, heat stress concentrates at the stepped portions 9c, and a crack is likely to be produced at the stepped portions 9c of the upper insulating layer 9.

In contrast, in the embodiment of the present invention illustrated in FIGS. 4 and 5, the height adjustment layers 36 and 37 prevent the stepped portions 9c from being formed in the upper insulating layer 9 and also prevent deformed portions resulting from the stepped portions from being formed in the shield layer 3. Thus, there is no region where large stress concentrates at the boundary between the upper insulating layer 9 and the shield layer 3, and a problem, such as breakage of the upper insulating layer 9 caused by heat stress, is less likely to arise.

Figure 7B:
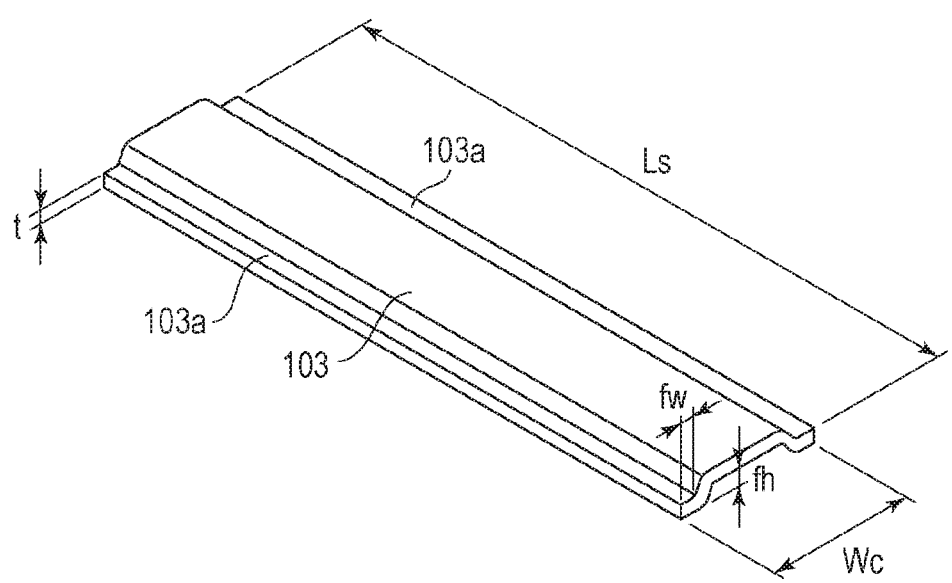
FIG. 7B is a perspective view illustrating a shield layer included in the current detection device according to the comparative example illustrated in FIG. 6.

In the current detection device 1 according to the embodiment of the present invention illustrated in FIGS. 4 and 5, the shield layer 3 is planar as illustrated in FIG. 7A. However, in the comparative example illustrated in FIG. 6, the stepped portions 9c cause deformed portions 103a to be formed at end portions on both sides in the Y direction of the shield layer 103, as illustrated in FIG. 7B. As a result, the anisotropic magnetic field Hk in the Y direction, which is the sensitivity-axis direction (P direction) of the magnetic detectors 11, 12, 13, and 14, is larger in the shield layer 3 illustrated in FIG. 7A than in the shield layer 103 illustrated in FIG. 7B, and the saturated magnetization in the Y direction of the shield layer 3 according to the embodiment is larger than the saturated magnetization in the Y direction of the shield layer 103 according to the comparative example. As a result, in the current detection device 1 according to the embodiment of the present invention, the use of the height adjustment layers 36 and 37 enables a shield effect in the Y direction of the shield layer 3 to be increased and enables the dynamic range for detecting the current I0 to be measured to be widened.

As illustrated in the circuit diagram in FIG. 8, the magnetic detectors 11, 12, 13, and 14 constitute a bridge circuit, and the midpoint voltage V1 obtained from the wiring path 8 and the midpoint voltage V2 obtained from the wiring path 7 are applied to a coil energization section 15. The coil energization section 15 includes a differential amplifier 15a and a compensation circuit 15b. The differential amplifier 15a mainly includes an operational amplifier and obtains, as a detected voltage Vd, a difference between the midpoint voltages V1 and V2 (V1−V2) input thereto. The detected voltage Vd is applied to the compensation circuit 15b, which generates a compensation current Id. The compensation current Id is applied to the feedback coil 30.

An integrated unit made up of the differential amplifier 15a and the compensation circuit 15b may be referred to as a compensation-type differential amplifier.

As illustrated in FIG. 8, the land portion 31 of the feedback coil 30 is connected to the compensation circuit 15b, and the land portion 32 is connected to a current detector 17. The current detector 17 includes a resistor 17a connected to the feedback coil 30 and a voltage detector 17b that detects a voltage affecting the resistor 17a.

Next, the operation of the current detection device 1 will be described.

As illustrated in FIG. 8, a current magnetic field H0 for measurement is induced by the current I0 that is to be measured and that flows in the X direction through the current path 40. The current magnetic field H0 is applied to the magnetic detectors 11, 12, 13, and 14. The current magnetic field H0 causes the resistance values of the magnetic detectors 11 and 14 to increase and causes the resistance values of the magnetic detectors 12 and 13 to decrease. Thus, the detected voltage Vd, which is an output value of the differential amplifier 15a, increases as the current I0 to be measured increases.

The compensation current Id is applied from the compensation circuit 15b to the feedback coil 30, and accordingly a cancelling current Id1 flows through the feedback coil 30. In the counter detector 30a, the current I0 to be measured and the cancelling current Id1 flow in directions opposite to each other, and thus the cancelling current Id1 causes a cancelling magnetic field Hd that cancels the current magnetic field H0 to affect the magnetic detectors 11, 12, 13, and 14.

If the current magnetic field H0 induced by the current I0 to be measured is larger than the cancelling magnetic field Hd, the midpoint voltage V1 obtained from the wiring path 8 is high, the midpoint voltage V2 obtained from the wiring path 7 is low, and the detected voltage Vd as an output of the differential amplifier 15a is high. At this time, the compensation circuit 15b generates the compensation current Id for increasing the cancelling magnetic field Hd and making the detected voltage Vd close to zero, and the compensation current Id is applied to the feedback coil 30. When the cancelling magnetic field Hd that affects the magnetic detectors 11, 12, 13, and 14 and the current magnetic field H0 are balanced and when the detected voltage Vd is lower than or equal to a predetermined value, the current flowing through the feedback coil 30 is detected by the current detector 17 illustrated in FIG. 8. The detected current is regarded as a measured value of the current I0.

In the current detection device 1, the shield layer 3 is disposed between the current path 40 and the magnetic detectors 11, 12, 13, and 14, and the current magnetic field H0 for measurement induced by the current I0 to be measured is absorbed. Thus, the current magnetic field H0 to be applied to the magnetic detectors 11, 12, 13, and 14 is attenuated. As a result, the range of change in the current I0 until the magnetoresistive elements of the magnetic detectors 11, 12, 13, and 14 are magnetically saturated can be widened, and the dynamic range can be widened.

Furthermore, with use of the height adjustment layers 36 and 37, deformation of the shield layer 3 can be prevented, the anisotropic magnetic field Hk can be increased, and saturated magnetization can be enhanced. Accordingly, the shield effect of the shield layer 3 can be increased and the dynamic range can be further widened.

As illustrated in FIG. 5, the shield layer 3 according to the embodiment is flat and has no change in height, in the Y direction which is the sensitivity-axis direction, that is, in the direction in which the current magnetic field H0 acts. Thus, a magnetic absorption effect of the shield layer 3 is proportional to change in the intensity of the current magnetic field H0, and the linearity of the detection output of the current detection device 1 can be increased. In contrast, the shield layer 103 according to the comparative example illustrated in FIG. 6 includes a bent portion of a magnetic path, the bent portion being produced due to the stepped portions 9c. As a result, the proportionality of the magnetic absorption effect of the shield layer 3 with respect to change in the intensity of the current magnetic field H0 decreases, and the linearity of the detection output of the current detection device 1 deceases.

EXAMPLES

The anisotropic magnetic field Hk in the Y direction was measured by using the shield layers 3 and 103 illustrated in FIGS. 7A and 7B, respectively.

The shield layers 3 and 103 are plated layers made of Ni—Fe alloy. The alloy composition is 80% by mass of Ni and 20% by mass of Fe. The shield layers 3 and 103 both have a thickness t of 16.5 μm. The shield layer 3 according to the embodiment of the present invention illustrated in FIG. 7A includes side portions 3a extending in the longitudinal direction (X direction) and end portions 3b extending in the lateral direction (Y direction). The width Ws in the lateral direction (Y direction) is 0.14 mm, and the length Ls in the longitudinal direction (X direction) is 0.81 mm. In the shield layer 103 according to the comparative example illustrated in FIG. 7B, a width Wc in the lateral direction is 0.14 mm, and a length Lc in the longitudinal direction is 0.81 mm. The shield layer 103 according to the comparative example includes, at both side portions thereof, deformed portions resulting from stepped portions. The deformed portions each have a step height Fh of 5.0 μm and a width fw of 12 μm.

Figure 9:
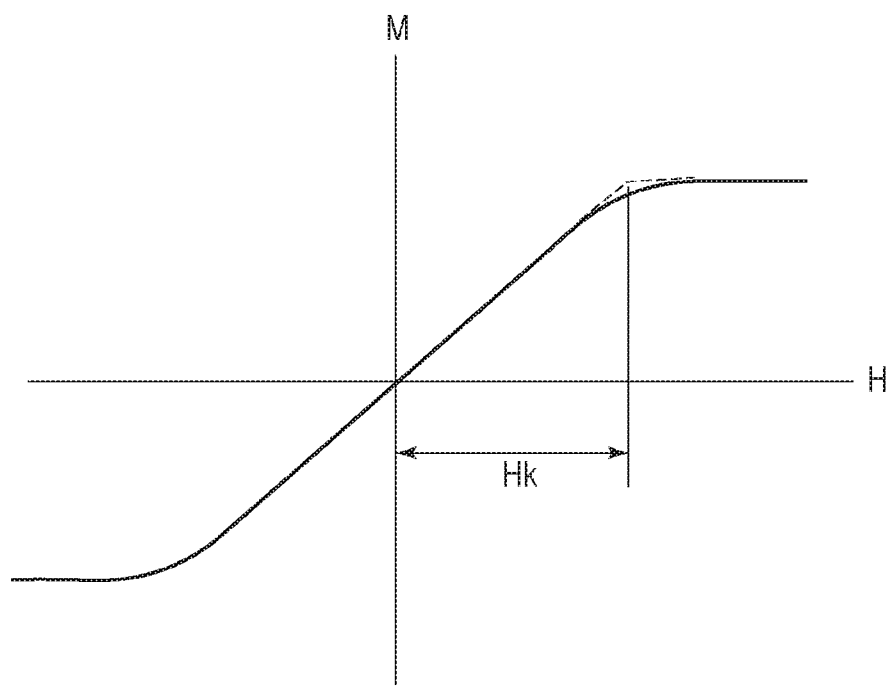
FIG. 9 is a chart for describing an anisotropic magnetic field Hk of the shield layer.

The anisotropic magnetic field Hk was actually measured for the shield layers 3 and 103. FIG. 9 illustrates a relationship between an external magnetic field (H) and magnetization (M) in the shield layer. The horizontal axis represents the intensity of the external magnetic field that affects in the sensitivity-axis direction (Y direction), and the vertical axis represents the magnitude of magnetization in the shield layer. The anisotropic magnetic field Hk is the intensity of the external magnetic field (H) until the magnetization of the shield layer is saturated.

The measured value of the anisotropic magnetic field Hk was 97.5 in the shield layer 3 according to the embodiment of the present invention illustrated in FIG. 7A, and the measured value of the anisotropic magnetic field Hk was 76.4 in the shield layer 103 according to the comparative example illustrated in FIG. 7B. In the current detection device 1 according to the embodiment of the present invention, the shield layer 3 illustrated in FIG. 7A is capable of obtaining a large anisotropic magnetic field compared to the shield layer 103, and thus capable of increasing saturated magnetization. Accordingly, the dynamic range of measurement of a current value can be widened.

Figure 11A:
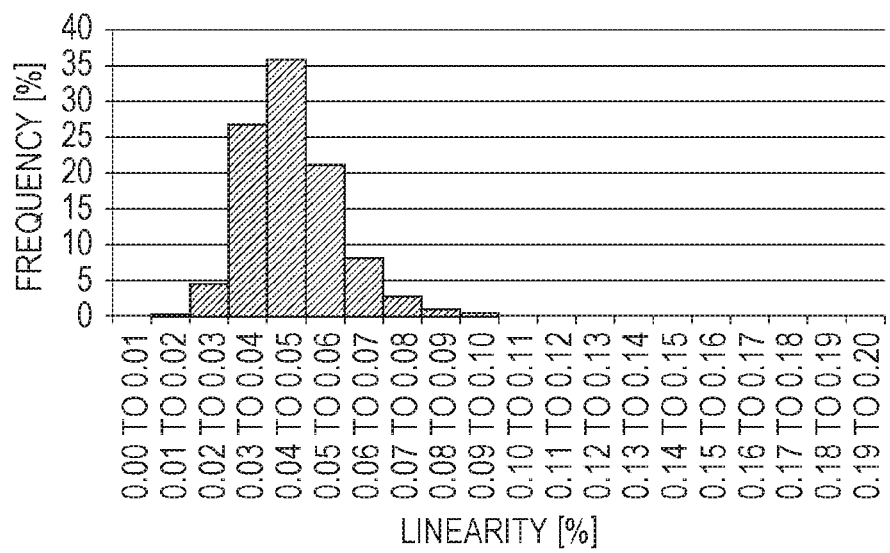
FIG. 11A is a bar graph of evaluating linearity of a detection output of the current detection device according to the embodiment of the present invention.
Figure 11B:
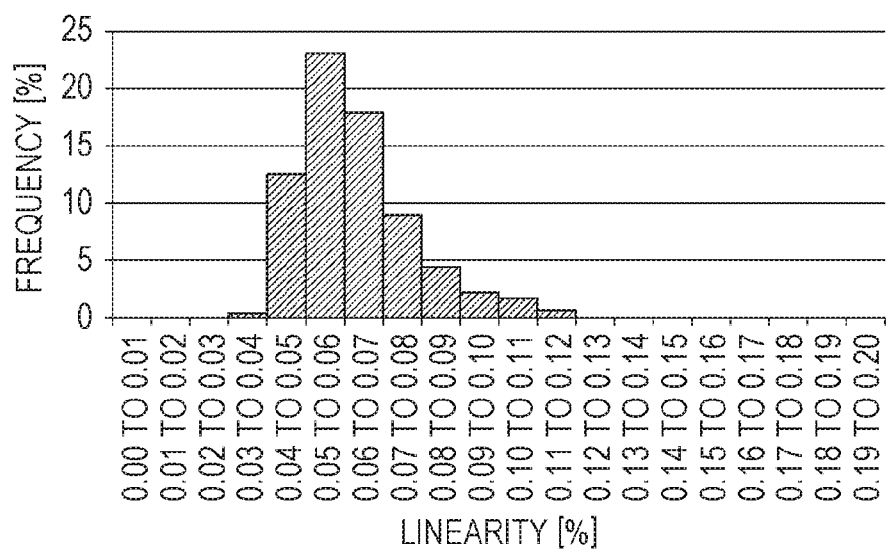
FIG. 11B is a bar graph of evaluating linearity of a detection output of the current detection device including the shield layer according to the comparative example illustrated in FIG. 7B.

FIG. 11A illustrates data about the linearity of a detection output of the current detection device 1 according to the embodiment of the present invention including the shield layer 3 illustrated in FIG. 7A, and FIG. 11B illustrates data about the linearity of a detection output of a current detection device including, instead of the shield layer 3, the shield layer 103 according to the comparative example illustrated in FIG. 7B.

Figure 10:
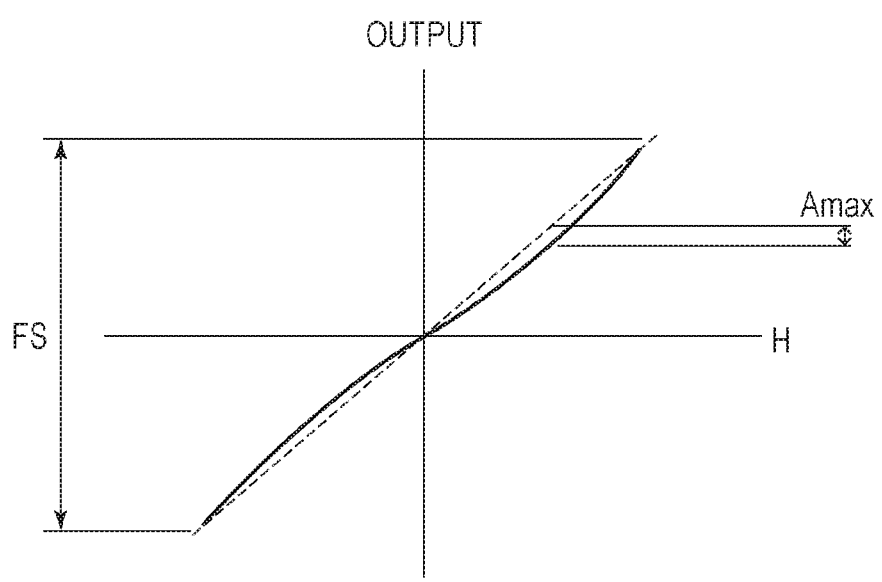
FIG. 10 is a chart for describing linearity of a full scale (FS) of a detection output.

FIG. 10 schematically illustrates a relationship between a full scale (FS) and linearity of a detection output of an external magnetic field H (current magnetic field H0) applied to the current detection device 1 in the sensitivity-axis direction. In FIG. 10, the straight broken line represents an ideal change in the external magnetic field H and a detection output, and the solid line represents an actually measured detection output of the current detection device 1. The linearity is obtained by calculating a maximum value Amax of an output difference between the detection output (solid line) and the straight line (broken line), and calculating (Amax/FS)×100%.

A plurality of (N=1000) current detection devices 1 were manufactured, each being the current detection device 1 according to the embodiment including the shield layer 3 illustrated in FIG. 7A, and the linearity (%) of a detection output was actually measured for each current detection device 1. Also, the same number of (N=1000) current detection devices, each including the shield layer 103 illustrated in FIG. 7B instead of the shield layer 3, were manufactured, and the linearity (%) of a detection output was actually measured for each current detection device.

In FIGS. 11A and 11B, the horizontal axis represents the ranges of linearity (%) as a measured value, each range having a width of 0.01%, and the vertical axis represents the frequency (%) of a measured value in each range having a width of 0.01%. As illustrated in FIG. 11A, the current detection devices 1 according to the embodiment of the present invention including the shield layer 3 are capable of suppressing the linearity of a detection output to 0.1% or less. In contrast, as illustrated in FIG. 11B, the linearity is more than 0.1% in some current detection devices including the shield layer 103.

Figure 12A:
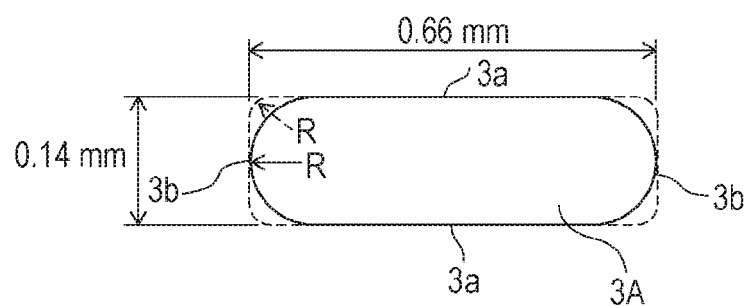
FIG. 12A is a plan view illustrating a shield layer according to Example 1 included in the current detection device according to the embodiment of the present invention.
Figure 12B:
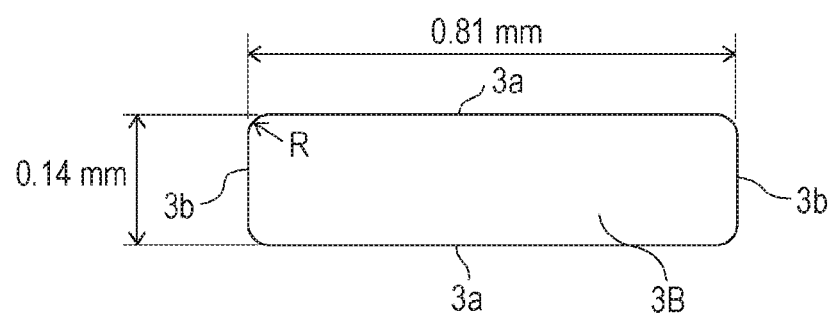
FIG. 12B is a plan view illustrating a shield layer according to Example 2 included in the current detection device according to the embodiment of the present invention.
Figure 12B:
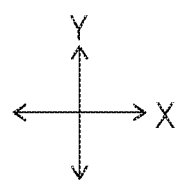

FIGS. 12A and 12B respectively illustrate a shield layer 3A according to Example 1 and a shield layer 3B according to Example 2, which are used in the current detection device 1 according to the embodiment of the present invention.

The shield layer 3B according to Example 2 illustrated in FIG. 12B is the same as the shield layer illustrated in FIG. 7A and has a thickness t of 16.5 µm, a width Ws in the lateral direction (Y direction) of 0.14 mm, and a length Ls in the longitudinal direction (X direction) of 0.81 mm. The shield layer 3A according to Example 1 illustrated in FIG. 12A has a thickness t of 16.5 µm, a width Ws in the lateral direction (Y direction) of 0.14 mm, and a length Ls in the longitudinal direction (X direction) of 0.66 mm. The shield layer 3A according to Example 1 and the shield layer 3B according to Example 2 have the same thickness t and the same width Ws in the lateral direction (Y direction), but the shield layer 3A according to Example 1 has a smaller length Ls in the longitudinal direction (X direction) than the shield layer 3B according to Example 2.

Figure 13:
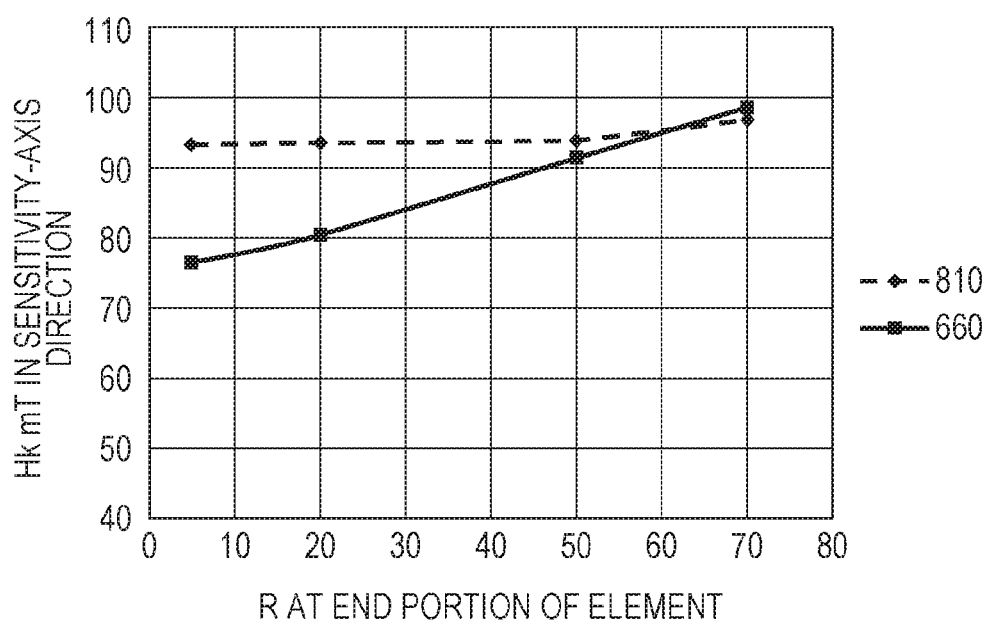
FIG. 13 is a chart for comparing anisotropic magnetic fields in a sensitivity-axis direction of the shield layers illustrated in FIGS. 12A and 12B.

In the shield layers 3A and 3B illustrated in FIGS. 12A and 12B, a convex curve portion (arc portion) R was formed at the end portions 3b oriented in the longitudinal direction (X direction) and a relationship between change in the size of R and the anisotropic magnetic field Hk was examined. The broken line in FIG. 13 represents a relationship between the size of R formed at the end portions 3b of the shield layer 3B according to Example 2 illustrated in FIG. 12B and change in the anisotropic magnetic field Hk (mT) in the sensitivity-axis direction (Y direction). The solid line in FIG. 13 represents a relationship between the size of R formed at the end portions 3b of the shield layer 3A according to Example 1 illustrated in FIG. 12A and change in the anisotropic magnetic field Hk (mT) in the sensitivity-axis direction (Y direction).

In FIG. 13, the horizontal axis represents the size of the arc portion R formed at the end portions 3b of each of the shield layers 3A and 3B. In each of the shield layer 3A and shield layer 3B illustrated in FIGS. 12A and 12B, the size of the arc portion R was changed in order: R=5 µm, 20 µm, 50 µm, and 70 µm (0.07 mm). The vertical axis in FIG. 13 represents the magnitude of the anisotropic magnetic field Hk (mT).

As represented by a broken line in FIG. 12A and a solid line in FIG. 12B, the arc portion R=5 µm, 20 µm, and 50 µm is formed at each of four corner portions where the side portions 3a and the end portions 3b cross each other in the individual shield layers 3A and 3B. In a case where R=70 µm (0.07 mm), as represented by a solid line in FIG. 12A, the arc portion extends over the entire length in the lateral direction (Y direction) at the end portions 3b, and a semicircular shape is formed such that the end portions 3b protrude in the longitudinal direction (X direction). Also in the shield layer 3B illustrated in FIG. 12B, when R=70 µm (0.07 mm), a semicircular shape is formed such that the end portions 3b protrude in the longitudinal direction (X direction).

As represented by the broken line in FIG. 13, in the shield layer 3B according to Example 2 in which the length Ls in the longitudinal direction (X direction) is 0.81 mm, a large difference is not seen in the anisotropic magnetic field Hk even if the size of R is sequentially increased from 5 µm to 70 µm. In contrast, as represented by the solid line in FIG. 13, in the shield layer 3A according to Example 1 in which the length Ls in the longitudinal direction (X direction) is 0.66 mm, the anisotropic magnetic field Hk can be significantly increased by increasing R. In the shield layer 3A according to Example 1, when R=70 µm and when the end portions 3b have a protruding curve over the entire length to form a semicircular shape, the anisotropic magnetic field Hk can be increased to be equivalent to that of the shield layer 3B according to Example 2. Accordingly, the saturated magnetic field can be increased.

An estimated reason the anisotropic magnetic field Hk increases as R increases is that, when R increases, a region not parallel to the sensitivity-axis direction (Y direction) extends in the X direction at the end portions 3b of the shield layer 3 and the magnetic anisotropy at the end portions 3b increases. An estimated reason the anisotropic magnetic field Hk is larger in the shield layer 3A according to Example 1 than in the shield layer 3B according to Example 2 even if the arc portions R at the end portions 3b have the same size is that the shape of the end portions 3b contributes more to the magnetic anisotropy as the ratio Ls/Ws between the length Ls and the width Ws in the shield layer decreases.

As can be understood from FIGS. 12A and 12B, if the length Ls is smaller than or equal to 0.7 mm in a case where the width Ws is 0.14 mm, an effect obtained by forming the end portions 3b having a protruding curve increases. Thus, the aspect ratio of Ls/Ws is preferably 0.7/0.14 or less, that is, Ls/Ws is preferably 5 or less. Furthermore, it is preferable that the end portions 3b have a protruding curve over the entire length in the lateral direction, and it is most preferable that the end portions 3b have a semicircular shape. In this way, as a result of forming a protruding curve portion at the end portions 3b, a saturated magnetic field can be increased even if the area of the shield layer 3 is small. Accordingly, decreasing the size of the current detection device can be promoted.

What is claimed is:

1. A current detection device comprising:
   a current path through which a current to be measured flows;
   a coil layer having a planer helical pattern, the coil layer including a detector portion facing the current path, the detector portion including a plurality of segments which are part of the helical pattern;
   a magnetic detector facing the current path via the detector portion of the coil layer;
   a lower insulating layer provided between the magnetic detector and the coil layer so as to cover the magnetic detector;
   a height adjustment layer made of a nonmagnetic metal, the height adjustment layer being provided on the lower insulating layer and disposed on both sides of the detector portion of the coil layer;
   an upper insulating layer made of an inorganic material, the upper insulating layer disposed on the lower insulating layer so as to cover the coil layer and the height adjustment layer;
   a shield layer disposed on the upper insulating layer below the current path over the detector portion of the coil layer and the height adjustment layer such that the shield layer covers the detector portion of the coil layer, the shield layer having side end portions located above the height adjustment layer;
   a coil energization section configured to control a current to be applied to the coil layer in accordance with an increase or decrease in a detection output of the magnetic detector; and
   a current detector coupled to the coil layer to detect an amount of current flowing in the coil layer.

2. The current detection device according to claim 1, wherein the detector portion of the coil layer and the height adjustment layer have a same height with respect to the lower insulating layer.

3. The current detection device according to claim 1, wherein the coil layer and the height adjustment layer are plated layers.

4. The current detection device according to claim 3, wherein the coil layer and the height adjustment layer are made of a same conductive metallic material.

5. The current detection device according to claim 1, wherein a length of the height adjustment layer in a first direction in which the current flows through the detector portion of the coil layer is greater than a length of the shield layer in the first direction.

6. The current detection device according to claim 1, wherein a width of the height adjustment layer in a crossing direction that crosses a first direction in which the current flows though the detector portion of the coil layer is greater than a width of the detector portion of the coil layer in the crossing direction.

7. The current detection device according to claim 1,
   wherein the shield layer extends in a first direction in which the current flows through the detector portion of the coil layer so as to have a length in the first direction greater than a width thereof perpendicular to the first direction, the shield layer having two sides extending in the first direction and two end portions,
   and wherein the end portions have a curved shape in plan view protruding outwardly over the entire width of the shield layer.

8. The current detection device according to claim 7, wherein the end portions have a substantially semicircular shape when in plan view.

9. The current detection device according to claim 7, wherein a sensitivity-axis direction of the magnetic detector is perpendicular to the first direction.

* * * * *